(12) United States Patent
Alvarez-Herault et al.

(10) Patent No.: US 11,017,828 B2
(45) Date of Patent: May 25, 2021

(54) APPARATUS FOR GENERATING A MAGNETIC FIELD AND METHOD OF USING SAID APPARATUS

(71) Applicant: Crocus Technology SA, Grenoble (FR)

(72) Inventors: Jeremy Alvarez-Herault, Grenoble (FR); Lucien Lombard, Grenoble (FR); Quentin Stainer, Montbonnot-St-Martin (FR); Jeffrey Childress, San Jose, CA (US)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 16/633,775

(22) PCT Filed: Jun. 25, 2018

(86) PCT No.: PCT/IB2018/054662
§ 371 (c)(1),
(2) Date: Jan. 24, 2020

(87) PCT Pub. No.: WO2019/021078
PCT Pub. Date: Jan. 31, 2019

(65) Prior Publication Data
US 2020/0243127 A1 Jul. 30, 2020

Related U.S. Application Data

(60) Provisional application No. 62/537,519, filed on Jul. 27, 2017.

(51) Int. Cl.
*G11C 11/16* (2006.01)
*H01F 7/02* (2006.01)
*H03K 19/18* (2006.01)

(52) U.S. Cl.
CPC ........ *G11C 11/1675* (2013.01); *G11C 11/161* (2013.01); *H01F 7/0294* (2013.01); *H03K 19/18* (2013.01)

(58) Field of Classification Search
CPC . G11C 11/1675; G11C 11/161; H01F 7/0297; H03K 19/18
See application file for complete search history.

(56) References Cited

U.S. PATENT DOCUMENTS 7,538,546 B2 * 5/2009 Patland ................ H01F 7/0273
324/210
8,559,214 B2 * 10/2013 Fukami ................ G11C 11/1659
365/158

(Continued)

FOREIGN PATENT DOCUMENTS

EP 1411365 A2 4/2004
EP 2626860 A1 8/2013

(Continued)

OTHER PUBLICATIONS

International Search Report for PCT/IB2018/054662 dated Oct. 19, 2018.
Written Opinion for PCT/IB2018/054662 dated Oct. 19, 2018.

*Primary Examiner* — Vanthu T Nguyen
(74) *Attorney, Agent, or Firm* — Pearne & Gordon LLP

(57) ABSTRACT

An apparatus for generating a magnetic field including permanent magnets arranged in a plane, each magnet being spatially separated along the plane from the adjacent magnet by a predetermined spacing, each magnet having a magnetic polarity opposed to the polarity of the adjacent magnet such that a magnetic field of adjacent magnets is oriented substantially perpendicular to the plane and in opposite directions, each magnet being spatially separated in the plane from the adjacent magnet by a nonmagnetic material. A (Continued)

method for programming a magnetic device or sensor device using the apparatus is also described.

12 Claims, 7 Drawing Sheets

(56) References Cited

U.S. PATENT DOCUMENTS

| | | | | |
|---|---|---|---|---|
| 8,611,140 | B2* | 12/2013 | El Baraji | G11C 11/1659 |
| | | | | 365/158 |
| 8,796,045 | B2* | 8/2014 | Worledge | G11C 11/1675 |
| | | | | 438/3 |
| 9,678,179 | B2* | 6/2017 | Kishi | G11C 11/1659 |
| 9,978,434 | B2* | 5/2018 | Conraux | G11C 11/1673 |
| 10,115,445 | B2* | 10/2018 | Stainer | G11C 11/1673 |
| 2011/0259733 | A1 | 10/2011 | Watanabe et al. | |
| 2015/0294708 | A1 | 10/2015 | Annunziata et al. | |

FOREIGN PATENT DOCUMENTS

| | | |
|---|---|---|
| EP | 3115994 A1 | 1/2017 |
| WO | 2013009941 A1 | 1/2013 |

\* cited by examiner

APPARATUS FOR GENERATING A MAGNETIC FIELD AND METHOD OF USING SAID APPARATUS

FIELD

The present invention is related to the production of a magnetic field, and, in particular, to producing a high magnetic field that has a substantially null power consumption and self-heating.

DESCRIPTION OF RELATED ART

Magnetic fields are often used in the production or testing of articles. For example, magnetic heads, which are used to read and write data on disk drives, magnetic random access memory (MRAM) or magnetic logic units (MLU) are generally tested while placed in a magnetic field. It is important to test such devices to ensure that a defective device is not installed within a disk drive, sensor, or memory system. Moreover, to reduce costs and/or to increase throughput, it is desirable to test for defective devices early in the production cycle.

MLU cells can be used to sense magnetic fields, in magnetic sensors or compasses. A MLU cell typically comprises a magnetic tunnel junction including a tunnel barrier layer between a reference layer having a reference magnetization and a sense layer having a free sense magnetization. The sense magnetization is orientable in the presence of the external magnetic field while the reference magnetization remains substantially undisturbed by the external magnetic field. The external magnetic field can thus be sensed by measuring a resistance of the magnetic tunnel junction that depends on the relative orientation of the sense magnetization, oriented by the external magnetic field, and the storage magnetization. A MLU-based sensor device includes a plurality of MLU cells typically arranged in an array. One type of tester used to ensure device performance and reliability early in the production cycle tests the magneto-resistive characteristics of the MLU cells while they are in wafer form, which includes thousands of MLU cells. Typically only a subset of the MLU cells in a wafer is tested. Testing MLU cells in wafer form requires a probe to contact one or more of the MLU cells while a magnetic field is generated in the plane of the particular MLU cell or MLU cells under test.

A high planar magnetic field can be applied at the wafer level while probing wafers or at package level. To achieve this, electromagnets are used to generate the magnetic field. However, electromagnets can generate magnetic fields typically having a magnitude between 1 to 3 kOe. Another issue with electromagnets is that self-heating is critical. A high magnitude magnetic field cannot be applied for a long time period without encountering problems with the heat generated by the coil. Electromagnets require a large power supply and have issues with power consumption, cost and size due to cooling requirements. Electromagnets are thus of limited or restricted use in the production of high magnitude magnetic fields during testing since the wafer or package would be subjected to high temperatures, or the testing would suffer from limited duty cycle.

SUMMARY

The present disclosure concerns a system comprising an apparatus for generating a high magnetic field. The apparatus comprises a plurality of permanent magnets arranged in a plane, each magnet being spatially separated along the plane from the adjacent magnet by a predetermined spacing, each magnet having a magnetic polarity opposed to the one of the adjacent magnet such that a magnetic field of adjacent magnets is oriented substantially perpendicular to the plane and in opposite directions, each magnet being spatially separated in the plane from the adjacent magnet by a nonmagnetic material. The system further comprises a magnetic device comprising a plurality of magnetic cells, each magnetic cell comprising a first magnetic layer having a first magnetization that is pinned at a low threshold temperature and freely orientable at a high threshold temperature, and a heating line physically separated from each of said plurality of magnetic cells and configured for passing a heating current pulse for heating any one of said plurality of magnetic cells. The magnetic field generated by the apparatus is configured for switching the first magnetization of any one of said plurality of magnetic cells being heated at the high threshold temperature, and the apparatus is arranged to be movable above or below the magnetic device, along the plane.

The present disclosure also pertains to a method for using the system for programming a magnetic device or sensor device using the apparatus.

The apparatus comprised in the system disclosed herein allows for generating a magnetic field with a magnitude of 10 kOe or even greater. The apparatus has substantially null power consumption and self heating, and is cost effective.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
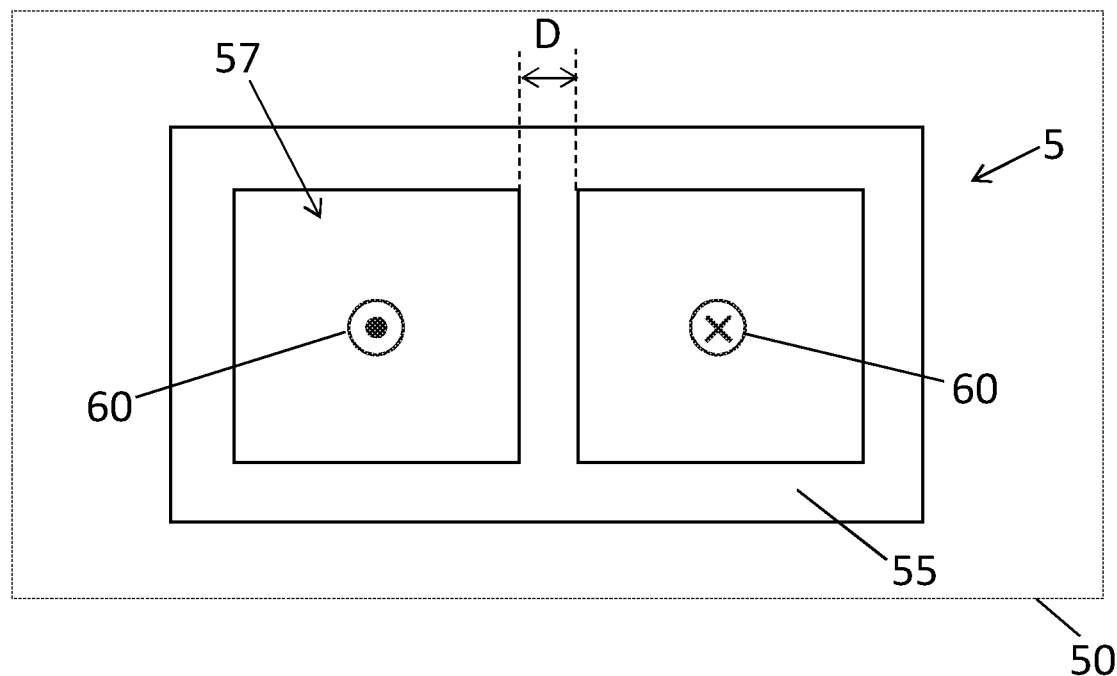
FIG. 1 shows a bottom view of an apparatus for generating a magnetic field and comprising a plurality of magnets, according to an embodiment.
Figure 2:
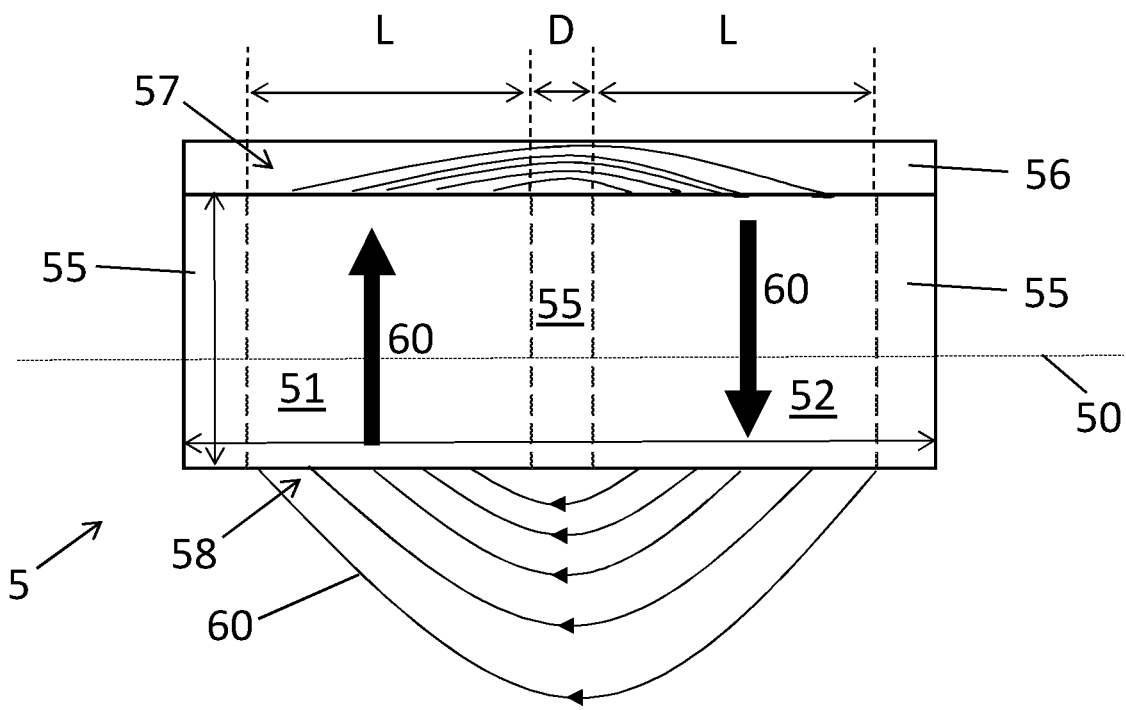
FIG. 2 shows a section view of the apparatus, according to an embodiment.

FIG. 1 shows a top view of an apparatus 5 for generating a magnetic field 60 and FIG. 2 shows a section view of the apparatus 5. The apparatus comprises a first permanent magnet 51 arranged alongside a second permanent magnet 52. The first magnet 51 has a magnetic polarity that is oriented in an direction opposite to the magnetic polarity of the second magnet 52, such that the first magnet 51 generate a magnetic field 60 in a direction opposed to the magnetic field 60 generated by the second magnet 52.

The first and second magnets 51, 52 are arranged alongside in a plane 50 such that the magnetic field 60 generated by each of the adjacent magnets 51, 52 is oriented substantially perpendicular to the plane 50 and in opposite direction. In the example of FIGS. 1 and 2, the first magnet 51 is shown with the magnetic field 60 directed "upwards", going out of an upper face of the first magnet 51 and the second magnet 52 is shown with the magnetic field 60 directed "downwards", going out of a lower face 58 of the second magnet 52.

The first magnet 51 is spatially separated along the plane 50 from the adjacent second magnet 52 by a predetermined spacing D.

In an embodiment, the first magnet 51 is spatially separated from the second magnet 52 by a nonmagnetic material 55. In other words, the predetermined spacing D is filled with the nonmagnetic material 55. The nonmagnetic material can comprise a plastic, metal, wood, or any other suitable rigid material with low magnetic susceptibility.

In a variant illustrated in FIG. 2, the first and second magnets 51, 52 can be embedded by the nonmagnetic material 55. In such configuration, the nonmagnetic material can form a frame 55 holding the two magnets 51, 52. In the variant of FIG. 2, only the upper face 57 and the lower face 58 of the magnets 51, 52 are not covered by the nonmagnetic frame.

Figure 3:
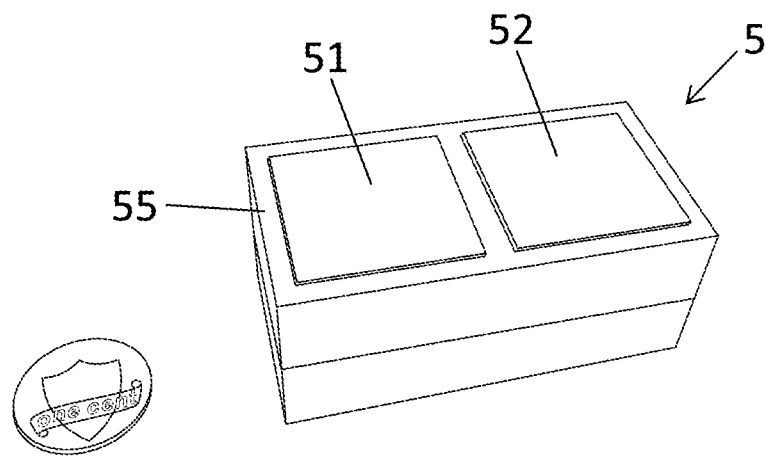
FIG. 3 illustrates magnets of the apparatus embedded by the nonmagnetic frame, according to an embodiment.

FIG. 3 shows the apparatus 5 comprising the first and second magnet 51, 52 embedded in a nonmagnetic frame 55. In this example, the magnets 51, 52 are substantially cubic shaped and have a side length of about 25 mm. However, the first and second magnet 51, 52 can have any other dimensions and any other suitable shape, such as rectangular, polygonal, cylindrical, etc.

Figure 4:
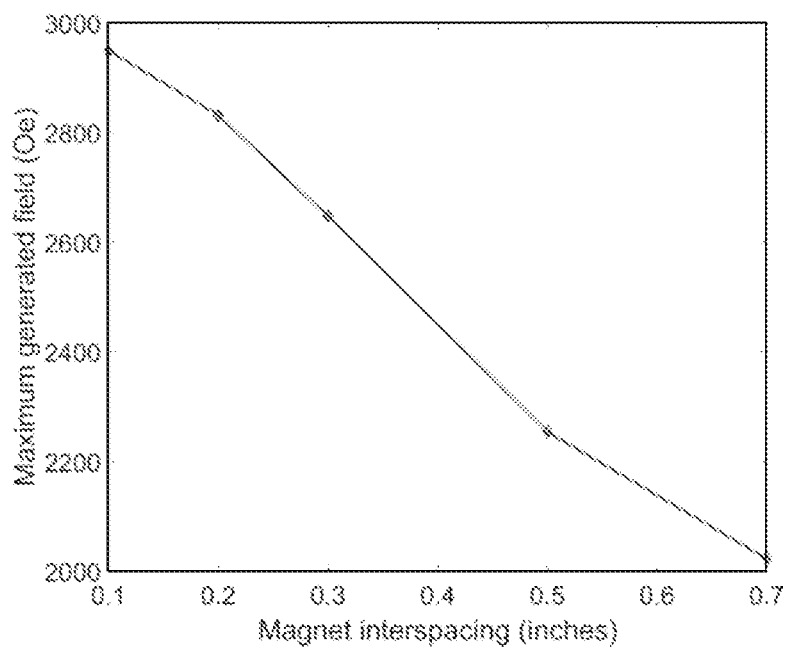
FIG. 4 shows the variation of the magnetic field generated by the apparatus as a function of the spacing between the magnets.

In FIG. 4, the amplitude of the magnetic field 60 generated by the apparatus 5 is plotted against the spacing D between the magnets 51, 52. FIG. 4 shows that the magnetic field 60 decreases with the spacing D.

Figure 5:
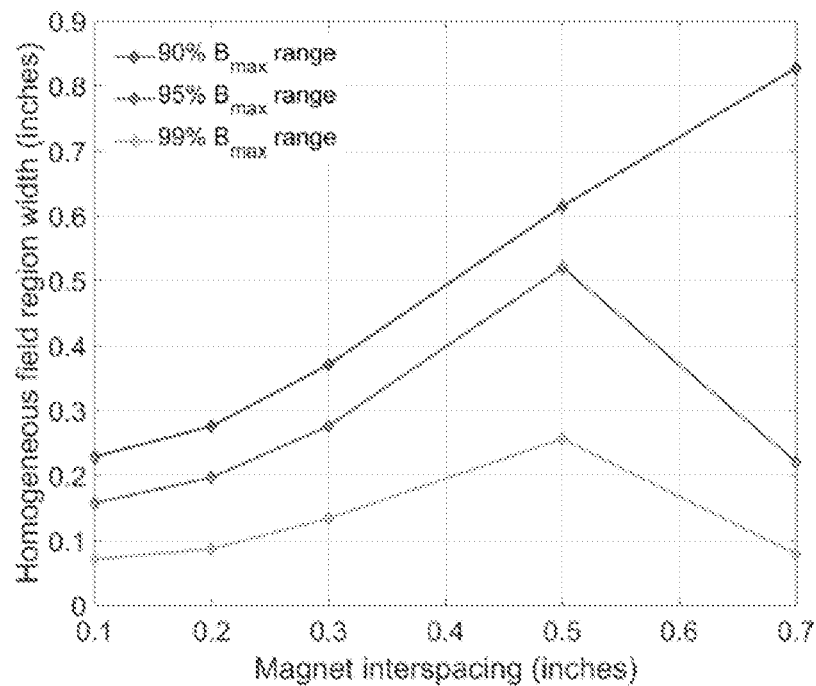
FIG. 5 reports the variation in homogeneity of the magnetic field generated by the apparatus as a function of the spacing between the magnets.

The graph shown in FIG. 5 reports the variation in homogeneity of the magnetic field 60 generated by the apparatus 5 as a function of the spacing D between the magnets 51, 52. The homogeneity of the magnetic field 60 increases with increasing spacing D and decreases for a spacing D greater than about 0.5 inches (12.7 mm). There is an optimum in homogeneity for a spacing of about 12.7 mm.

In an embodiment, the predetermined spacing D is between 0.25 mm and 50 mm. Preferably, the predetermined spacing D is between 1.2 mm and 25 mm.

In another embodiment, a lateral dimension L of the magnet 51, 52 (or its width) along the plane 50 is between 2.5 mm and 80 mm. Preferably, the lateral dimension L of the magnet 51, 52 is between 12 mm and 50 mm.

In yet another embodiment, the apparatus 5 comprises a plate 56 comprising iron lying in the plane 50, adjacent to a surface of the apparatus 5. The addition of the plate 50 to one face of the magnets 51, 52 (upper face 57 in the example of FIG. 2) provides a significant, increase in magnetic field 60 on the face opposed to the one where the plate 56 is added (lower face 58 in the example of FIG. 2). The plate 56 can further improve the uniformity and the maximum value of the generated magnetic field 60.

In an embodiment, the plate 56 has a thickness between 0.25 mm and 50 mm. Preferably, the plate 56 has a thickness between 5 mm and 25 mm.

It is understood that the present invention is not limited to the exemplary embodiments described above and other examples of implementations are also possible within the scope of the patent claims.

For example, the apparatus 5 can comprise a plurality of permanent magnets 51, 52 arranged in the plane 50, wherein each magnet is spatially separated in the plane 50 from the adjacent magnet by the predetermined spacing D. In such configuration, each magnet 51, 52 has a magnetic polarity opposed to the one of the adjacent magnet such that the magnetic field 60 of adjacent magnets is oriented substantially perpendicular to the plane 50 and in opposite directions.

Figure 6:
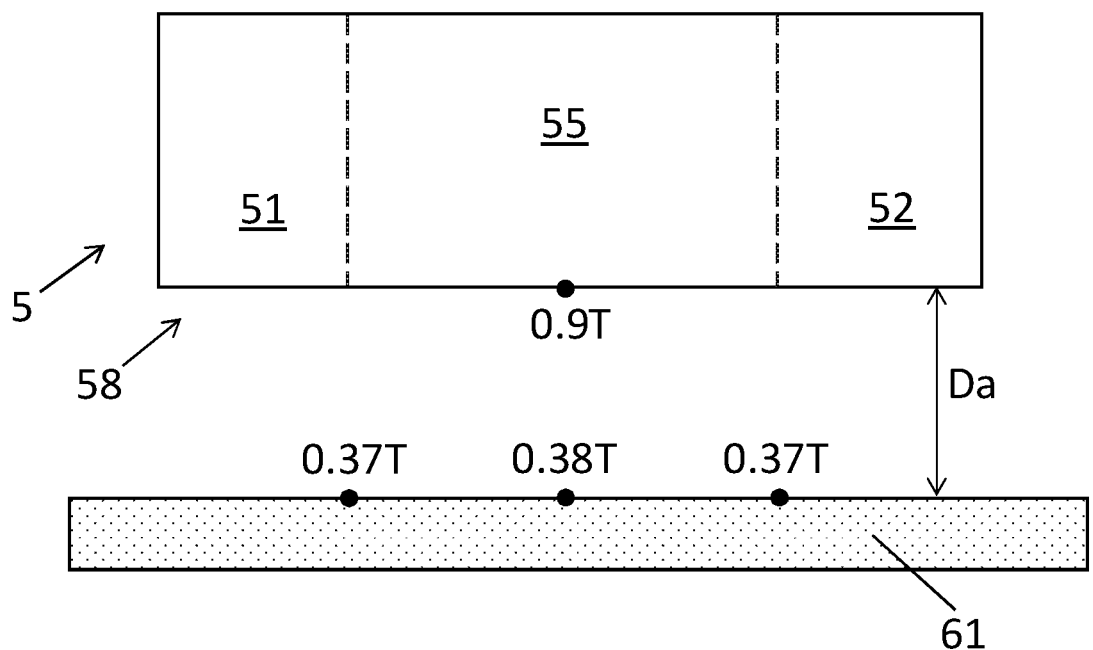
FIG. 6 illustrates a close-up of the apparatus and an article located in the vicinity of the apparatus.

FIG. 6 illustrates a close-up of the apparatus 5 where a portion of two adjacent magnets 51, 52 and the spacing D in nonmagnetic material 55 are visible as well as an article 61 located in the vicinity of the apparatus 5.

This example shows exemplary magnitudes of the magnetic field 60 at the surface (lower face 58) of the apparatus 5 and at the surface of the article located at an article distance Da of about 0.5 cm. In this example, the magnetic field 60 in the middle of the spacing 55 has a magnitude of 0.9 T (Tesla). The magnitude of the magnetic field 60 at the surface of the article 61 in a position perpendicular to the middle of the spacing 55 is about 0.38 T. The magnitude of the magnetic field 60 is about 0.37 T at the surface of the article 61 in a position perpendicular to the boundary between the first magnet 51 and the spacing 55 and the boundary between the second magnet 52 and the spacing 55. The magnetic field 60 is homogenous at the surface of the article 61.

Since the magnitude of the magnetic field 60 decreases with increasing the distance Da between the article and the apparatus 5, the geometry (thickness, lateral dimensions) of the magnets 51, 52 can be adapted in order to obtain a magnitude of the magnetic field 60 compatible with the distance Da and the application for which the filed 60 is applied.

The magnitude of the fixed magnetic field 60 can be optimized by a proper selection of the material comprised in the magnets 51, 52.

The apparatus 5 disclosed herein can be used for in production, testing of articles or for programming a magnetic device or sensor. For example, magnetic and magneto-optic heads, which are used to read and write data on disk drives, are generally tested while placed in a magnetic field.

Figure 7:
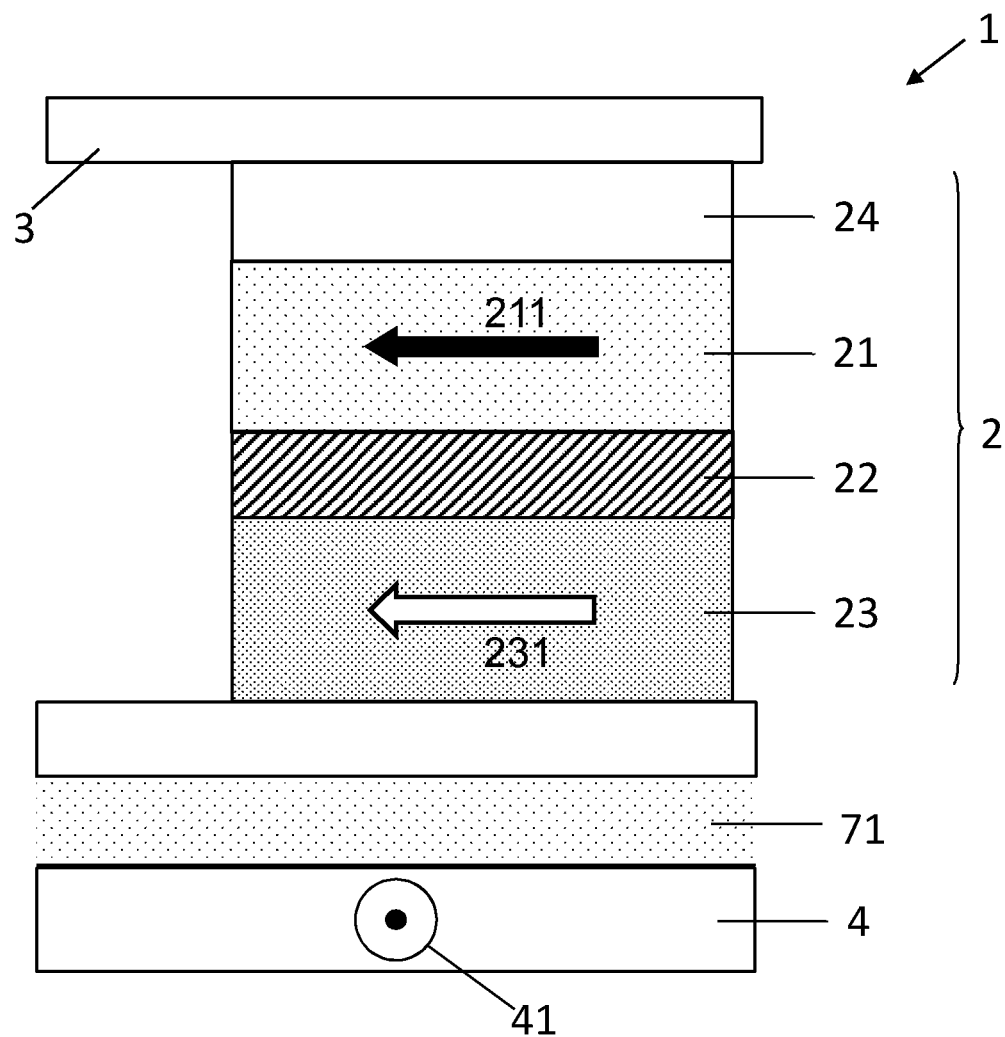
FIG. 7 represents an example of a MLU cell.

FIG. 7 represents an example of a MLU cell 1 comprising a magnetic tunnel junction 2 included between a first current line 3. The magnetic tunnel junction 2 comprises a first ferromagnetic layer 21 having a first magnetization 211, a second ferromagnetic layer 23 having a second magnetization 231, and a tunnel barrier layer 22 between the first and second ferromagnetic layers 21, 23. The first magnetic layer 21 can be a reference layer and the second ferromagnetic layer 23 can be a sense layer. Each of the first and second ferromagnetic layer 21, 23 includes, or is formed of, a magnetic material and, in particular, a magnetic material of the ferromagnetic type. The relative positioning of the first ferromagnetic layer 21 and the second ferromagnetic layer 23 can be reversed, with the first ferromagnetic layer 21 disposed above the second ferromagnetic layer 23. The tunnel barrier layer 22 can include, or be formed of, an insulating material such as an oxide as aluminum oxide (e.g., $Al_2O_3$) and magnesium oxide (e.g., MgO).

One of the first and second magnetizations 211, 231 can be magnetically fixed and the other have a variable magnetization direction. Preferably, the sense layer 21 can have a linear and non-hysteretic behavior when oriented by the external magnetic field in order to facilitate the measurement of small variations of an external magnetic field. That is relevant when sensing the external magnetic field (such as the earth's magnetic field) having an average value on the order of 0.5 Oersted (Oe). An external magnetic field can be sensed by measuring a resistance R of the magnetic tunnel junction 2 that depends on the relative orientation of the first and second magnetizations 211, 231.

The magnetic tunnel junction 2 can also include an antiferromagnetic layer 24 pinning, through exchange bias, the first magnetization 211 along a particular direction when a temperature within, or in the vicinity of, the antiferromagnetic layer 24 is at a low threshold temperature $T_L$, i.e., below a blocking temperature, such as a Neel temperature, or another threshold temperature of the antiferromagnetic layer 24. The antiferromagnetic layer 24 unpins, or frees, the first magnetization 211 when the temperature is at the high threshold temperature $T_H$, i.e., above the blocking temperature, thereby allowing the first magnetization 211 to be switched to another direction. The antiferromagnetic layer 24 can include, or can be formed of, a magnetic material of the antiferromagnetic type.

The second (sense) magnetization 231 can be unpinned and be freely adjustable at the low and high threshold temperatures $T_L$, $T_H$.

In the case of a thermally assisted switching (TAS) based MLU cell, the first magnetization is pinned at a low threshold temperature $T_L$, and can be switched only when the MLU cell 1 is at a high threshold temperature $T_H$.

Figure 8:
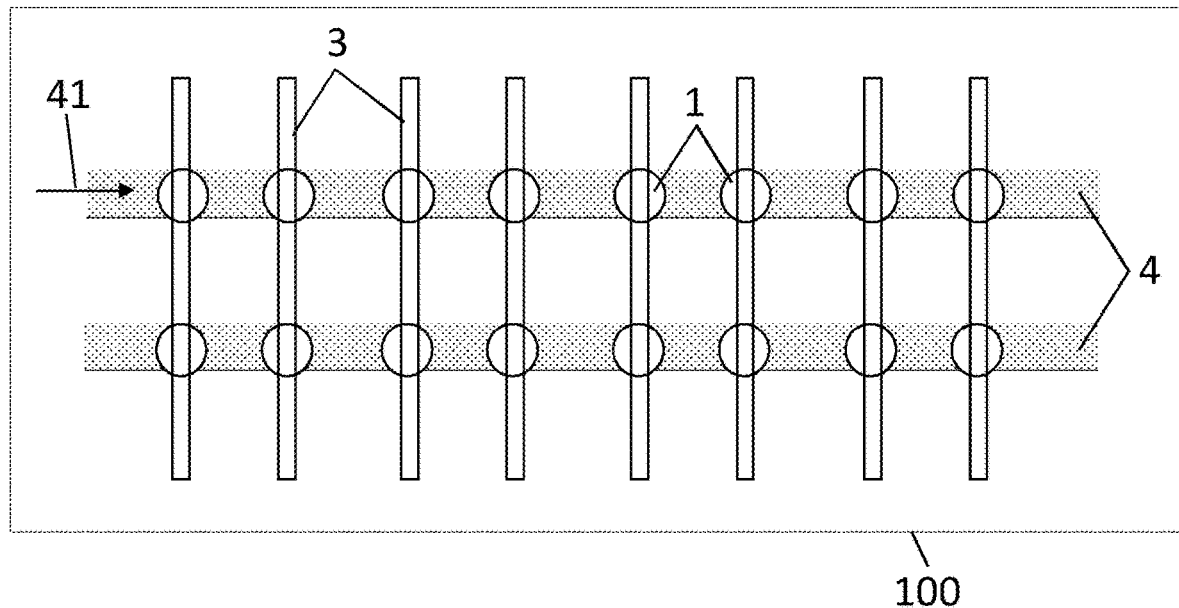
FIG. 8 illustrate a top view of a MLU-based device comprising a plurality of MLU cells, according to an embodiment.

FIG. 8 illustrate a top view of a MLU-based device 100 comprising a plurality of the MLU cells 1 arranged in an array of row and columns, each MLU cell 1 being at the intersection of the first current line 3 and the second current line 4.

Figure 9:
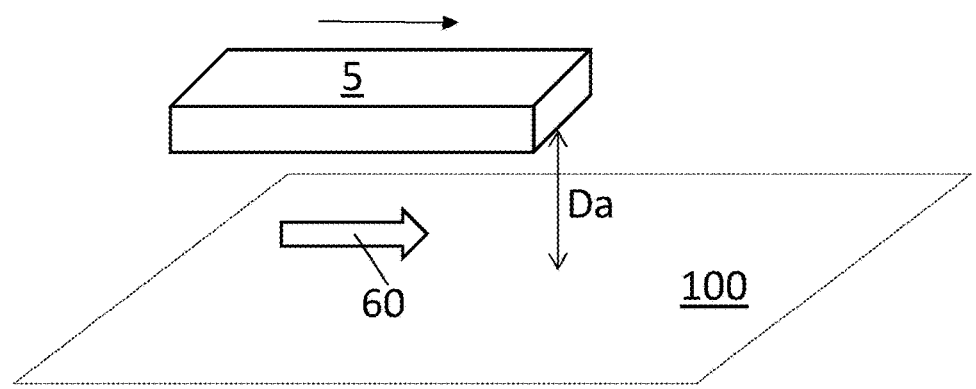
FIG. 9 shows a system comprising the apparatus and an MLU-based device, according to an embodiment.

In an embodiment shown in FIG. 9, a system comprises the apparatus 5 and an MLU-based device 100. The apparatus 5 can be brought in the vicinity of the MLU-based device 100 and used to apply a magnetic field 60 to the MLU-based device 100 such as to switch on of the first and second magnetization 211, 231 of the MRAM cells 1 that are heated at the high threshold temperature $T_H$.

According to an embodiment, a method for programming the MLU-based device 100 comprises the steps of:
providing the apparatus 5;
heating any one of said plurality of MLU cells 1 to the high threshold temperature $T_H$ by passing the heating current pulse 41 in the heating line 4;
once said any one of said plurality of MLU cells 1 are at the high threshold temperature $T_H$, applying the magnetic field 60 generated by the apparatus 5 such as to switch the first (reference) magnetization 211 of said any one of said plurality of MLU cells 1.

As shown in FIG. 7, the heating line 4 and the magnetic tunnel junction 2 are physically separated from one another by an electrically non-conductive layer, represented by a dielectric or oxide layer 71. The heating line 4 can thus be magnetically and thermally coupled to the magnetic tunnel junction 2 but is not in electrical contact with the magnetic tunnel junction 2. The heating current pulse 41 can have an intensity such that the magnetic tunnel junction 2 can be heated at the high threshold temperature $T_H$. The heat generated by Joule effect through the heating line 4 by passing the heating current pulse 41 is transmitted to the magnetic tunnel junction 2 by thermal conduction through the dielectric/oxide layer 71.

Figure 10:
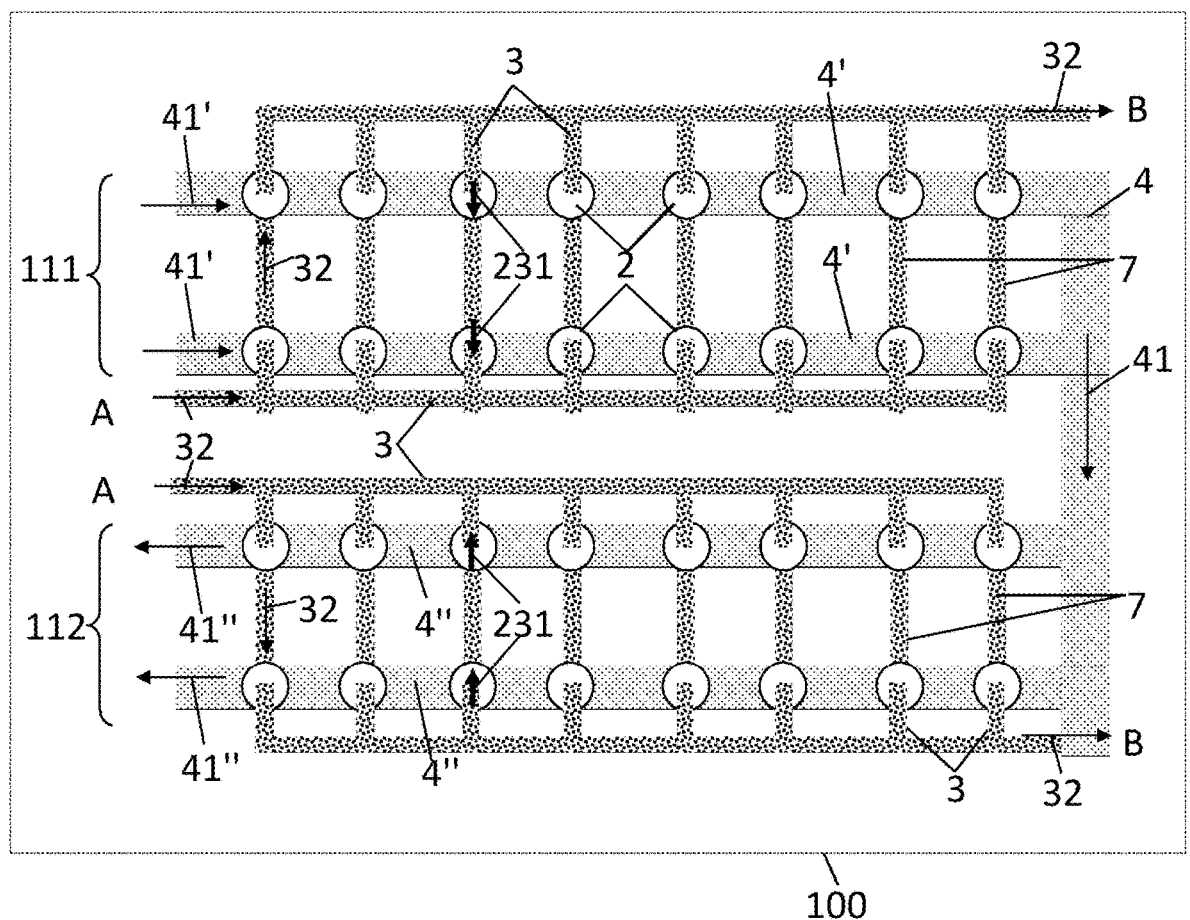
FIG. 10 illustrates a top view of a MLU-based device, according to another embodiment.

FIG. 10 illustrate a top view of a MLU-based device 100 comprising a plurality of MLU cells 1 arranged in an array of row and columns, each row having MLU cells 1 connected in series via a bit line 3 and a conductive strap. A heating line 4 is configured for passing a heating current pulse 41 for heating any one of said plurality of MLU cells 1. The heating line 4 comprises one or a plurality of first branches 4', each first branch 4' being arranged for heating a first subset 111 comprising one or more rows of said plurality of MLU cells 1. The heating line 4 further comprises one or a plurality of second branch 4", each second branch 4" being arranged for heating a second subset 112 comprising one or more rows of said plurality of MLU cells 1. The first branches 4' can be electrically connected in series to the second branches 4".

Due to the configuration of the first and second branches 4', 4" forming a "U" shape or a serpentine, the heating current pulse 41 can pass in the first branches 4' and in the second branches 4" with opposed directions. However, the heating current pulse 41 could also pass in the first branches 4' and in the second branches 4" with the same direction.

According to an embodiment, a method for programming the MLU-based device 100 comprises the steps of:
re-orienting the reference magnetization 211 of the MLU cells 1 in the first subset 111 in a first direction; and
re-orienting the reference magnetization 211 of the MLU cells 1 in the second subset 112 in a second direction opposed to first direction.

In an embodiment, said re-orienting the reference magnetization 211 of the MLU cells 1 in the first subset 111 comprises passing a first heating current pulse 41' in the first branch 4' such as to heat the MLU cells 1 in the first subset 111; and
once said any the MLU cells 1 in the first subset 111 are at the high threshold temperature $T_H$, the first magnetic field 60 generated by the apparatus 5 will re-orient the reference magnetization in the desired direction; and
after orienting the magnetic field generated by the apparatus 5 in another desired direction, passing a second heating current pulse 41" in the second branch 4" such as to heat the MLU cells 1 in the second subset 112; and
once said any the MLU cells 1 in the second subset 112 are at the high threshold temperature $T_H$, the second magnetic field 60 generated by the apparatus 5 will re-orient the reference magnetization in the desired direction.

In an embodiment, the first magnetic field 60 is applied by moving the apparatus 5 along the plane in a first direction to program the reference magnetization 211 of the MLU cells 1 in the first subset 111 in a first programmed direction. The second magnetic field 60 is applied by moving the apparatus along the plane 50 in a second direction opposed to the first direction to program the reference magnetization of the MLU cells 1 in the second subset 112 in a second programmed direction opposed to the first programmed direction.

In another embodiment, the MLU-based device 100 is first annealed while an external magnetic field is applied such as to switch the reference magnetization 211 of the plurality of MLU cells 1 in a first switched direction. The second magnetic field 60 is then applied by moving the apparatus 5 along the plane 50 in the second direction to program the reference magnetization 211 of the MLU cells 1 in the second subset 112 in the second programmed direction.

Figure 11:
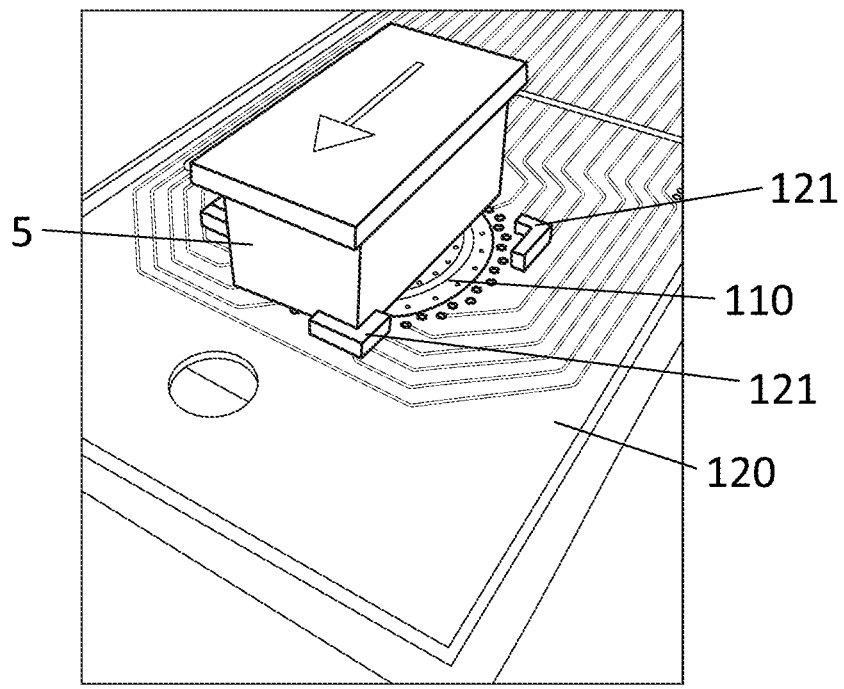
FIGS. 11 and 12 show the apparatus used for applying a magnetic field to a wafer under a probe card, according to an embodiment.
Figure 12:
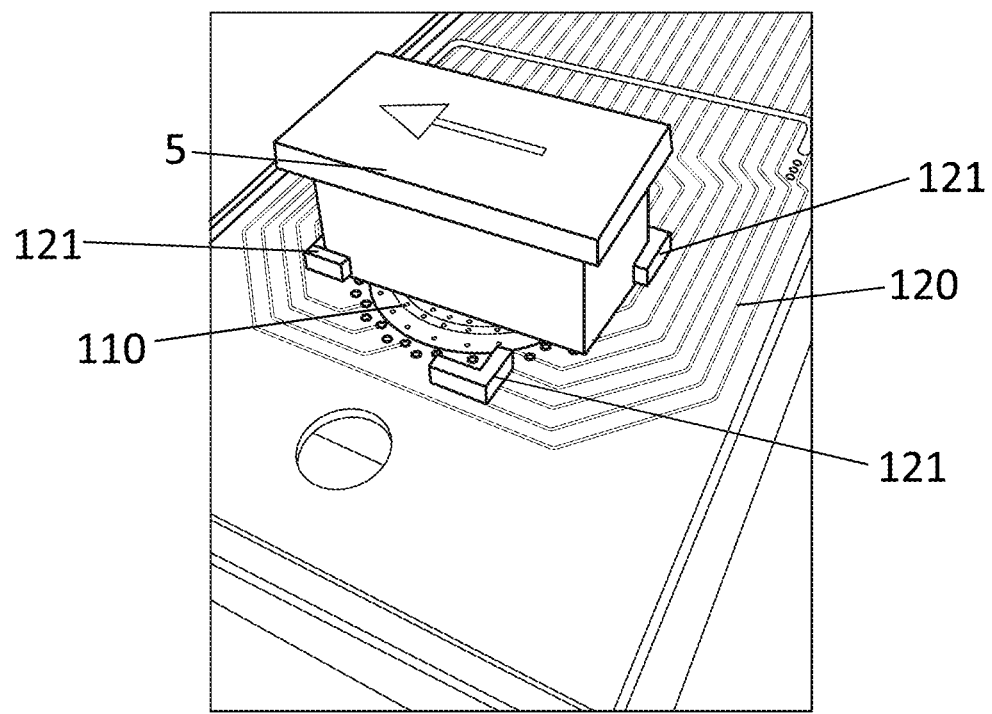

As shown in FIGS. 11 and 12, the apparatus 5 can be used for applying a magnetic field 60 under a probe card 120 and to one or several MLU-based devices 100 or a wafer 110 comprising one or several MLU-based devices 100. The apparatus 5 can further be put above or below packages comprising one or several MLU-based devices. The fixed magnetic field 60 generated by the apparatus 5 can be applied in any direction, depending on the polarity of magnets 51, 52 and on the direction in which the apparatus 5 is moved.

Fixation means 121 can be provided such as to attach the apparatus 5 fixedly to the probe card 120. In the examples shown in FIGS. 11 and 12, fixation means comprise abutments 121 configured for disposing the apparatus 5 in two orthogonal orientation relative to the probe card 120.

REFERENCE NUMBERS AND SYMBOLS

1 MLU cell
100 MLU-based device
110 wafer
111 first subset
112 second subset
120 probe card
121 fixation means
2 magnetic tunnel junction
21 first ferromagnetic layer, sense layer
211 first magnetization, sense magnetization
22 tunnel barrier layer
23 second ferromagnetic layer, reference layer
231 second magnetization, reference magnetization
24 antiferromagnetic layer
3 first current line
32 sense current
4 second current line
4' first branch
4" second branch
41 heating current pulse
5 apparatus
50 plane
51 first magnet
52 second magnet
55 nonmagnetic material, frame
56 plate
57 upper face
58 lower face
60 external magnetic field
61 article
71 dielectric/oxide layer
D spacing
Da article distance
L lateral dimension
R junction resistance
$T_H$ high threshold temperature
$T_L$ low threshold temperature

What is claimed is:

1. A system comprising:
an apparatus for generating a magnetic field, the apparatus comprising a plurality of permanent magnets arranged in a plane, each magnet being spatially separated along the plane from the adjacent magnet by a predetermined spacing, each magnet having a magnetic polarity opposed to the one of the adjacent magnet such that a magnetic field of adjacent magnets is oriented substantially perpendicular to the plane and in opposite directions, each magnet being spatially separated in the plane from the adjacent magnet by a nonmagnetic material;
a magnetic device comprising a plurality of magnetic cells, each magnetic cell comprising a first magnetic layer having a first magnetization that is pinned at a low threshold temperature and freely orientable at a high threshold temperature, and a heating line physically separated from each of said plurality of magnetic cells and configured for passing a heating current pulse for heating any one of said plurality of magnetic cells; and
a plate lying in the plane, adjacent to a surface of the apparatus, the plate comprising a ferromagnetic or paramagnetic material, wherein:
the magnetic field generated by the apparatus is configured for switching the first magnetization of any one of said plurality of magnetic cells being heated at the high threshold temperature,
the apparatus is arranged to be movable above or below the magnetic device, along the plane, and
the plate is on the face of the apparatus opposed to the face on the side of the magnetic device.

2. The system according to claim 1, wherein said predetermined spacing is between 0.25 mm and 50 mm.

3. The system according to claim 1, wherein said predetermined spacing is between 1.2 mm and 25 mm.

4. The system according to claim 1, wherein a lateral dimension of the magnet along the plane is between 2.5 mm and 80 mm.

5. The system according to claim 1, wherein a lateral dimension of the magnet in the plane is between 12 mm and 50 mm.

6. The system according to claim 1, wherein said plate has a thickness between 0.25 mm and 50 mm.

7. The system according to claim 1, wherein said plate has a thickness between 5 mm and 25 mm.

8. The system according to claim 1, comprising two magnets.

9. A method for using a system comprising an apparatus for generating a magnetic field, and a magnetic device; the magnetic device comprising a plurality of magnetic cells, each magnetic cell comprising a first magnetic layer having a first magnetization that is pinned at a low threshold temperature and freely orientable at a high threshold temperature, and a heating line physically separated from each of said plurality of magnetic cells and configured for passing a heating current pulse for heating any one of said plurality of magnetic cells, wherein the heating line comprises at least one first branch arranged for programming a first subset comprising one or more rows of said plurality of magnetic cells, and at least one second branch arranged for programming a second subset comprising one or more rows of said plurality of magnetic cells adjacent to said one or more rows of said plurality of magnetic cells of the first subset; the apparatus comprising a plurality of permanent magnets arranged in a plane, each magnet being spatially separated in the plane from the adjacent magnet by a predetermined spacing, each magnet having a magnetic polarity opposed to the one of the adjacent magnet such that a magnetic field of adjacent magnets is oriented substantially perpendicular to the plane and in opposite directions, each magnet being spatially separated in the plane from the adjacent magnet by a nonmagnetic material; wherein the method comprises:
heating any one of said plurality of magnetic cells to the high threshold temperature by passing the heating current pulse in the heating line;

once said any one of said plurality of magnetic cells are at the high threshold temperature, applying the magnetic field generated by the apparatus for reorienting the first magnetization of said any one of said plurality of magnetic cells;

re-orienting the reference magnetization of the magnetic cells in the first subset in a first direction; and re-orienting the reference magnetization of the magnetic cells in the second subset in a second direction opposed to first direction, wherein the apparatus is moved during application of the magnetic field.

10. The method according to claim 9, wherein said re-orienting of the reference magnetization of the magnetic cells in the first subset comprises passing a first heating current pulse in said at least one first branch such as to heat the magnetic cells in the first subset; and once said any the magnetic cells in the first subset are at the high threshold temperature, providing a first magnetic field generated by the apparatus; and passing a second heating current pulse in said at least one second branch such as to heat the magnetic cells in the second subset; and once said any the magnetic cells in the second subset are at the high threshold temperature, providing a second magnetic field generated by the apparatus.

11. The method according to claim 10, wherein said providing a first magnetic field comprises moving the apparatus along the plane in a first direction to program the reference magnetization of the magnetic cells in the first subset in a first programmed direction; and wherein said providing a second magnetic field comprises moving the apparatus along the plane in a second direction opposed to the first direction to program the reference magnetization of the magnetic cells in the second subset in a second programmed direction opposed to the first programmed direction.

12. The method according to claim 9, wherein said providing a first magnetic field comprises annealing the magnetic device and providing an external magnetic field to switch the first magnetization of the plurality of magnetic cells in a first switched direction; and wherein said providing a second magnetic field comprises moving the apparatus along the plane in a second direction opposed to the first direction to program the first magnetization of the magnetic cells in the second subset in a second programmed direction opposed to the first programmed direction.

* * * * *